United States Patent [19]

Radtke et al.

[11] 3,710,378

[45] Jan. 9, 1973

[54] ANALOG TO DIGITAL CONVERTER

[75] Inventors: Joseph D. Radtke; William W. Kiffmeyer, both of Milwaukee, Wis.

[73] Assignee: Allen-Bradley Company, Milwaukee, Wis.

[22] Filed: March 22, 1971

[21] Appl. No.: 126,730

[52] U.S. Cl. ........................340/347 AD, 235/151.11

[51] Int. Cl. ..............................................H03k 13/02

[58] Field of Search.340/347 AD; 235/92 PE,151.11; 318/601

[56] References Cited

UNITED STATES PATENTS

| | | | |
|---|---|---|---|
| 3,541,546 | 11/1970 | French | 340/347 AD |
| 3,521,269 | 7/1970 | Brooks | 340/347 AD |
| 3,587,092 | 6/1971 | Kelly | 340/347 AD |
| 3,581,118 | 5/1971 | Zurk | 235/92 PE |
| 3,588,885 | 6/1971 | Schaal | 340/347 AD |
| 3,549,870 | 12/1970 | Lay | 340/347 AD |

*Primary Examiner*—Thomas A. Robinson
*Assistant Examiner*—Jeremiah Glassman
*Attorney*—Barry E. Sammons and Thomas O. Kloehn

[57] ABSTRACT

An analog error signal is received from a machine tool position sensor. Its magnitude is sensed by a comparator circuit including an operational amplifier and a digital output level is generated when a particular analog voltage level is sensed. The digital output level resets the position sensor to restore the analog output signal and the comparator circuit to their initial state. A reset circuit, including two monostable circuits, generate a delayed reset pulse to the input of the comparator to reset its output if the analog input signal fails to do so. Forward and reverse directional circuits including NAND logic gates are connected together in parallel to the comparator output and conditioned by forward and reverse reference signals to convey the digital output from the comparator when the machine is moving in the direction to which the comparator has been preconditioned.

9 Claims, 2 Drawing Figures

INVENTORS
WILLIAM W. KIFFMEYER
JOSEPH D. RADTKE

BY Barry E. Sammons

ATTORNEY

INVENTORS
WILLIAM W. KIFFMEYER
JOSEPH D. RADTKE

BY

Barry E. Sammons

ATTORNEY

ANALOG TO DIGITAL CONVERTER

BACKGROUND OF THE INVENTION

In a numerical control system such as that described in the copending application MULTI-LOOP POSITION CONTROL SYSTEM filed Mar. 16, 1970, Ser. No. 19,942, a resolver type position sensor generates an analog error signal indicating the direction and amount of machine displacement from a reference point. By electrically shifting or resetting the sensor's reference point one increment in the direction of machine motion, a single high resolution resolver can be used for both large and small machine displacements. Each increment of machine displacement must be sensed, a digit stored in a machine position storage and the resolver reset to keep it well within its operating range.

It is essential in such a numerical control system that an analog to digital converter be provided which will sense the level of a position sensor analog output signal and generate a digital output level for the position storage and the resolver reset circuit. To count subsequent increments of machine displacement, the converter must be capable of resetting itself or being reset by the position sensor output signal when the sensor is reset. The present invention is a circuit created to satisfy all of these needs not only in the specific numerical control system referred to, but wherever there is a need for an analog to digital converter having such a capability.

SUMMARY OF THE INVENTION

The present invention relates to an analog to digital converter for digitizing the analog output signal of a machine tool position sensor whose reference point is reset by each generated digit. More particularly, the analog to digital converter includes a comparator circuit connected to receive the analog signal and change the logic state of its output when the signal reaches a predetermined voltage level; a forward sensing circuit connected to receive the comparator output and a forward reference signal, and change the state of its output when the comparator output changes state and the machine tool is moving in the forward direction; and a reverse sensing circuit connected to receive the comparator output and a reverse reference signal, and change the state of its output when the comparator changes state and the machine tool is moving in the reverse direction. The outputs of the forward and reverse sensing circuits are summed to form the digital signal of the converter.

Under normal operating conditions the comparator is reset when the analog input signal amplitude responds to the resetting of the position sensor. However, the present invention includes an automatic reset circuit which generates a delayed reset pulse to the comparator input after a digital output pulse is generated.

A general object of the invention is to sense the level of an analog signal and generate a digital output signal when a predetermined magnitude is sensed.

Another object of the invention is to provide a circuit which will sense and generate a digit when the analog voltage reaches a certain magnitude of one polarity when the machine is moving forward and generate a digit when the analog voltage reaches the same magnitude but with the opposite polarity when the machine is moving in reverse. The forward and reverse sensing circuits are conditioned by the forward and reverse reference voltages to only respond to changes in the comparator output state when the machine is moving in the preconditioned direction.

The analog to digital converter of the present invention is entirely solid state, static device which can be constructed with a minimum number of conventional commercially available integrated circuits. As a result, the analog to digital converter of the present invention is a highly reliable circuit, requiring minimum power and space, which can be built at a minimum cost.

DESCRIPTION OF THE PREFERRED EMBODIMENTS

Figure 1:
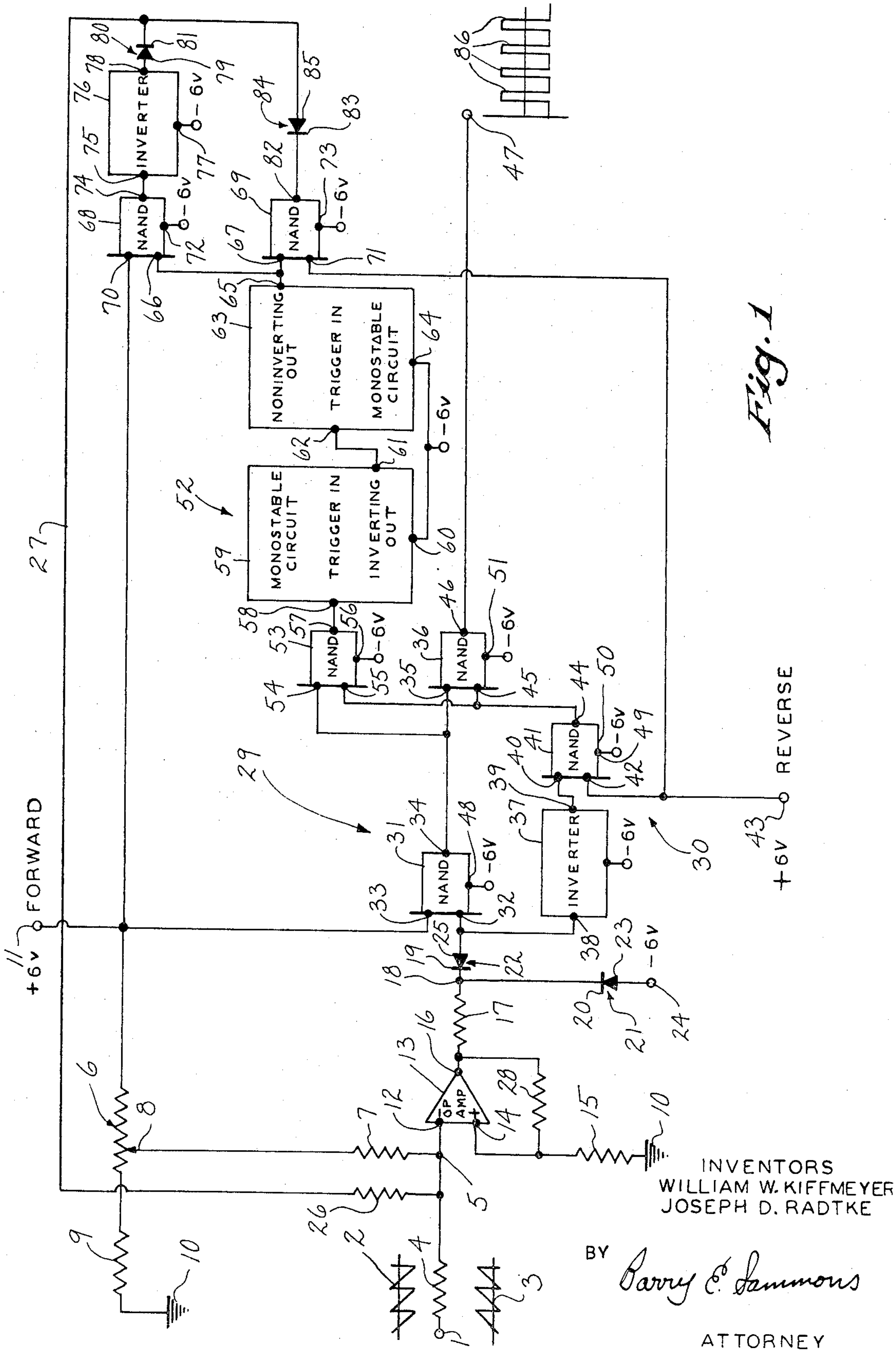
FIG. 1 is a schematic diagram of the preferred embodiment of the invention.

An analog signal input terminal 1 is illustrated on the left hand side of the drawing with graphical representation above and below it, of analog input signals 2 and 3 respectively. The analog input signals are transmitted to the input terminal 1 from a detector (not shown) such as that disclosed in the copending application of Odo J. Struger entitled "Detector," Ser. No. 25,069, filed Apr. 2, 1970. The detector (not shown) receives the output from a resolver type position sensor (not shown) which is driven by a machine tool the position of which is being controlled. The resolver output is an amplitude modulated carrier, the phase and amplitude of which represent direction of movement and distance from a reference point. The upper analog signal 2 represents machine tool movement in the forward direction and the lower analog signal 3 represents movement of the machine tool in the reverse direction.

The analog input signal is applied to the input terminal 1 of a comparator circuit. The input terminal 1 connects through a coupling resistor 4 to a summing point 5. The slider 8 of a reference signal potentiometer 6 connects through a balancing resistor 7 to the summing point 5. One end of the reference potentiometer 6 is connected through a drop resistor 9 to common ground 10 and its other end connects to a forward signal input terminal 11. The input terminal 11 is connected to an external source which provides a positive voltage level when the machine tool moves in the forward direction and a negative voltage level when the machine tool moves in reverse.

The summing point 5 connects to an inverting input terminal 12 of an operational amplifier 13. The amplifier's noninverting input terminal 14 connects through a resistor 15 to common ground 10, and its output terminal 16 connects through a coupling resistor 17 to the cathodes 19 and 20 of respective clamping diodes 21 and 22. The anode 23 of clamping diode 21 connects to a negative six-volt supply terminal 24 and the anode 25 of the other blocking diode 22 connects to the forward and reverse sensing circuits described infra. A positive feedback resistor 28 is connected between the output terminal 16 of the operational amplifier 13 and its noninverting input terminal 14. A reset resistor 26 connects an automatic reset line 27 to the summing point 5 and inverting input terminal 12 of the operational amplifier 13.

The junction point 18 between the clamping diodes 21 and 22 forms the output of the comparator circuit and the input to a direction sensing circuit. The direction sensing circuit includes a forward sensing circuit 29 and a reverse sensing circuit 30. The terms forward and reverse as applied to the specific embodiments of this invention refer to the direction of machine slide movement, but as used herein they are intended to indicate mutually exclusive circuit conditions regardless of the particular information manifested by those conditions. The forward sensing circuit 29 contains a NAND logic gate 31 which has one input terminal 32 connected to the cathode of clamping diode 22 and another input terminal 33 connected to the forward signal input terminal 11. The forward NAND circuit 31 also has an output terminal 34 which is connected to one input terminal 35 of an output NAND circuit 36.

The reverse sensing circuit 30 has an inverter 37, an input terminal 38 of which is also connected to the cathode of the clamping diode 22. An output terminal 39 of the inverter 37 is connected to one input terminal 40 of a reverse sensing NAND gate 41. The reverse sensing NAND circuit 41 has its other input terminal 42 connected to a reverse signal input terminal 43 that receives either a positive six-volt signal or a negative 6-volt signal from an external source (not shown). An output terminal 44 of the reverse sensing NAND circuit 41 is connected to a second input terminal 45 of the output NAND circuit 36, and the output NAND circuit 36 has an output terminal 46 that is connected to an output terminal 47 of the converter circuit. Each of the logic circuits 31, 36, 37 and 44 has its ground terminal 48, 49, 50 and 51, respectively, connected to a negative 6-volt source (not shown).

The forward and reverse reference signals applied to the respective input terminals 11 and 43 are digital signals which indicate the direction of machine motion. There are numerous methods and means known to those skilled in the art for generating such direction signals. The present invention contemplates the application of such a direction signal to the forward signal input terminal 11 and the inversion of the direction signal to the reverse signal input terminal 43.

The fourth component of this converter is an automatic reset circuit 52. The reset circuit 52 has an input NAND circuit 53 which has two input terminals 54 and 55 which are connected to the respective output terminals 34 and 44 of the forward and reverse NAND circuits 31 and 41, in parallel with the input terminals of the output NAND circuit 36. A ground terminal 56 of the input NAND circuit 53 is connected to a negative 6-volt source and an output terminal 57 is connected to a trigger terminal 58 of a first monostable circuit 59. The first monostable circuit 59 has a ground terminal 60 connected to a negative 6-volt source and an inverting output terminal 61 connected to a trigger terminal 62 of a second monostable circuit 63. The second monostable circuit 63 has a ground terminal 64 connected to a negative 6-volt source and a noninverting output terminal 65 connected to input terminals 66 and 67, respectively, of a forward reset NAND circuit 68 and a reverse reset NAND circuit 69. Another input terminal 70 of the forward reset NAND circuit 68 is connected to the forward signal input terminal 11, and another input terminal 71 of the reverse reset NAND circuit 69 is connect to the reverse signal input terminal 43. Both the forward reset NAND circuit 68 and the reverse reset NAND circuit 69 have ground terminals 72 and 73, respectively, connected to a negative 6-volt source. The forward reset NAND circuit 68 has an output terminal 74 connected to the input terminal 75 of an inverter 76. The output terminal 78 of the inverter 76 connects to the anode 79 of a blocking diode 80. The cathode 81 of the blocking diode 80 is connected to the automatic reset conductor 27. The reverse reset NAND 69 has an output terminal 82 connected to the cathode 83 of a second blocking diode 84, the anode 85 of which is connected to the automatic reset conductor 27.

The NAND circuits 31, 36, 41, 53, 68 and 69 perform a negated AND logic function which is represented by the following formula: $\overline{A \cdot B}$ The NAND circuit used herein is a logic gate which produces a logic low output *only* when logic high input signals appear on both of its input terminals. The electrical circuits capable of carrying out this operation are numerous and as such are not a part of the invention. Similarly, the inverters 37 and 76 are commercially procured circuits which serve to invert the logic high or low appearing at their input terminal. Inverter circuits are numerous in their configuration and types of components employed, and as such are not a part of the present invention.

The monostable circuits 59 and 63 are also commercially procured, integrated circuits. When triggered, the monostable circuits 59 and 63 generate a positive pulse, or logic high, of fixed duration at their noninverting output and a negative pulse, or logic low, of fixed duration at their inverting output. The circuit is triggered by a positive step function which occurs either at the leading edge of a positive voltage pulse of the trailing edge of a negative voltage pulse. Commonly, a monostable circuit is made from a transistorized bistable circuit by inserting a capacitor in one of the collector-to-base coupling circuits to suppress one of the two stable states.

Finally, in the comparator circuit the operational amplifier 13 operates in combination with the feedback resistor 28 and resistor 15 as a level detector. The feedback resistor 28 provides positive feedback to drive the output of the operational amplifier 13 into a saturated condition when a net current flows into or out of its inverting input terminal 12.

In considering the operation of the analog digital converter, assume initially that the input signal is a forward input signal 2 as illustrated in the graph immediately above the analog input terminal 1 and that a positive 6 volts has been imposed on the forward signal input terminal 11 and a negative 6 volts on the reverse input terminal 43. The slider 8 on the reference potentiometer 6 is set to a predetermined point and a fixed current flows through the balancing resistor into the inverting input 12 saturating the operational amplifier output negative, or low. As the machine moves, the forward input signal 2 becomes progressively more negative until it reaches a magnitude at which current begins to flow out the inverting input 12. At this point the operational amplifier output changes logic state, saturating positive or high. This change in logic state is interpreted by the converter as described infra to generate a digital output pulse 86 which represents an increment of machine tool displacement to the numerical control system. It is a feature of the numerical control system to which the present invention is applied, that the reference point of the machine position sensor (in this embodiment a resolver) is reset electrically one increment of machine displacement each time a digital output pulse 86 is generated. Such a system is described more fully in the copending application entitled MULTI-LOOP POSITION CONTROL SYSTEM filed Mar. 16, 1970, Ser. No. 19,942. To understand the present invention it is only necessary, however, to know that under normal operating conditions, when the machine is moving in the forward direction, a digital output pulse 86 will reset the position sensor reference point causing a step increase in the analog signal 2. Thus as the machine tool moves, the sawtooth shaped analog output signal 2 is generated by the repeated resetting of the position sensor reference point each time the magnitude of its output signal drops to the negative level sensed by the comparator circuit.

The level at which a digit is counted is determined by the setting of the slider 8 on the reference potentiometer 6. When the position sensor reference point is reset and the analog input signal 2 rises above the detection level of the comparator, the operational amplifier is reset and its output saturates negative or low.

When the forward input signal 2 drops below the predetermined voltage level and the resulting high appears at the output 16 of the operational amplifier 13, the input terminal 32 of the forward NAND gate 31 also goes high. The positive 6-volt forward signal from the forward input terminal 11 appears on the other input terminal 33 and a low is consequently generated at the output terminal 34 of the forward NAND gate 31. This low appears on the input terminal 35 of the output NAND circuit 36. The other input terminal 45 of the output NAND circuit 36 is always high when the machine is operating in the forward direction because a low is applied to the reverse terminal 43 and input terminal 42 of the reverse NAND circuit 41 when the machine moves forward. Thus the appearance of the low on the input terminal 35 of the output NAND 36 generates a high at the output terminal 47 of the converter. This high constitutes the digital output signal representing one increment of machine displacement. The position sensor is reset as a result of this high and the converter output drops in response. As a consequence, a series of positive output pulses 86 is generated by the converter as the machine tool moves.

As described above, under normal operating conditions the generation of a positive output level at the converter output terminal 47 resets the resolver and the operational amplifier 13 producing a series of pulses 86. If resetting does not occur, however, the reset circuit 52 operates to generate a reset pulse to the summing point 5 a predetermined time after generation of the positive output level. The reset input NAND circuit 53 is connected in parallel with the output NAND circuit 36 and consequently generates a positive voltage, or high, concurrent with that generated at the output terminal 47. The leading edge of this high triggers the first monostable circuit 59 which in turn generates a negative pulse to the trigger input terminal 62 of the second monostable circuit 63. This negative pulse is of predetermined duration and its trailing edge triggers the second monostable circuit 63. The consequent positive pulse, or high, generated at the noninverting output terminal 65 is applied to the input terminal 66 of the forward reset NAND circuit 68, the other input of which is held high by the positive forward signal at the forward input terminal 11. A low is consequently generated at the output of the forward reset NAND circuit 68, inverted to a high by the inverter 65, and applied through the blocking diode 80 and reset resistor 26 to the input of the operational amplifier 13. If the operational amplifier was not previously reset by the forward input signal 2, the positive reset current pulse drives the amplifier output terminal 16 low thus resetting the converter output low. The time delay before application of the automatic reset pulse is determined by the duration of the negative pulse generated at the inverting output terminal 61 of the first monostable circuit 59 and can be adjusted to meet various operating conditions.

When the machine moves in the reverse direction, a positive six volts is applied to the reverse terminal 43 and a negative six volts is applied to the forward terminal 11. As a consequence the output of the operational amplifier 13 is saturated positive until the reverse analog input signal 3 reaches a predetermined positive voltage level. When this occurs, the amplifier output goes low and as described infra a positive digital output signal is generated by the converter. As when operating in the forward direction, the high output resets the position sensor. However, when operating in reverse, the result is a step decrease in the analog signal 3, which decrease resets the operational amplifier output high and the converter output low to generate a pulse 86.

To generate the output pulse 86 when operating in reverse, the low at output terminal 16 of the operational amplifier 13 is applied to the input terminal 38 of the inverter 37. The low is inverted to a high which is applied to the input terminal 40 of the reverse NAND circuit 41. The other input terminal 42 of the reverse NAND 41 is high by virtue of its connection to the reverse input terminal 43, and consequently, a low is generated to the input terminal 45 of the output NAND circuit 36. The other input terminal 35 of the output NAND circuit 36 is always high when the machine is operating in a reverse direction due to the low applied to the input terminal 33 of the forward NAND circuit 31. Consequently, when the operational amplifier output 16 saturates low, a positive output level is generated at the converter output terminal 47 and the pulse 86 is formed when the converter is subsequently reset.

The reset circuit 52 operates in the reverse direction essentially the same as described above for the forward direction. The monostable circuits 59 and 63 operate the same, generating a delayed positive pulse at the noninverting output terminal 65 and the input terminal 67 of the reverse reset NAND circuit 69. The other input terminal 71 of the reverse reset NAND circuit 69 is high and a low is produced at the output 82 of the reverse reset NAND circuit 69. This low is conducted through the coupling diode 84 and reset resistor 26 to the summing point 5 where it resets the operational amplifier output terminal 16 back to a high state if the reverse analog signal 3 has failed to do so previously.

It is thus the essence of the analog to digital converter to employ a comparator which will sense the level of an analog input signal and produce either a high or a low level output depending upon the polarity of the voltage level sensed and maintain the high or low level output until either the analog signal resets the comparator or until an automatic reset signal arrives to reset the comparator. Under normal operating conditions the polarity of the voltage level sensed is determined by machine direction and a digital output signal is produced at the converter output each time the level is sensed by the comparator. If the polarity of the analog input signal is incorrect, indicating that the machine is moving in the wrong direction, the analog to digital converter circuit will produce no output pulse. In a numerical control system this condition can be compensated for by employing a second analog to digital converter circuit to produce a digital output signal when the machine is moving in the wrong direction only. The digital output of this second analog to digital circuit, (not shown) is fed to the machine position storage to reflect the erroneous direction so that the system can provide the necessary correction.

If the analog input signal from the resolver fails to reset the comparator at the proper time, subsequent counts, or increments of machine motion are missed by the system. The automatic reset circuit in this instance supplies the necessary reset signal to the comparator so the analog to digital converter will continue to produce pulses 86 as the machine moves.

Figure 2:
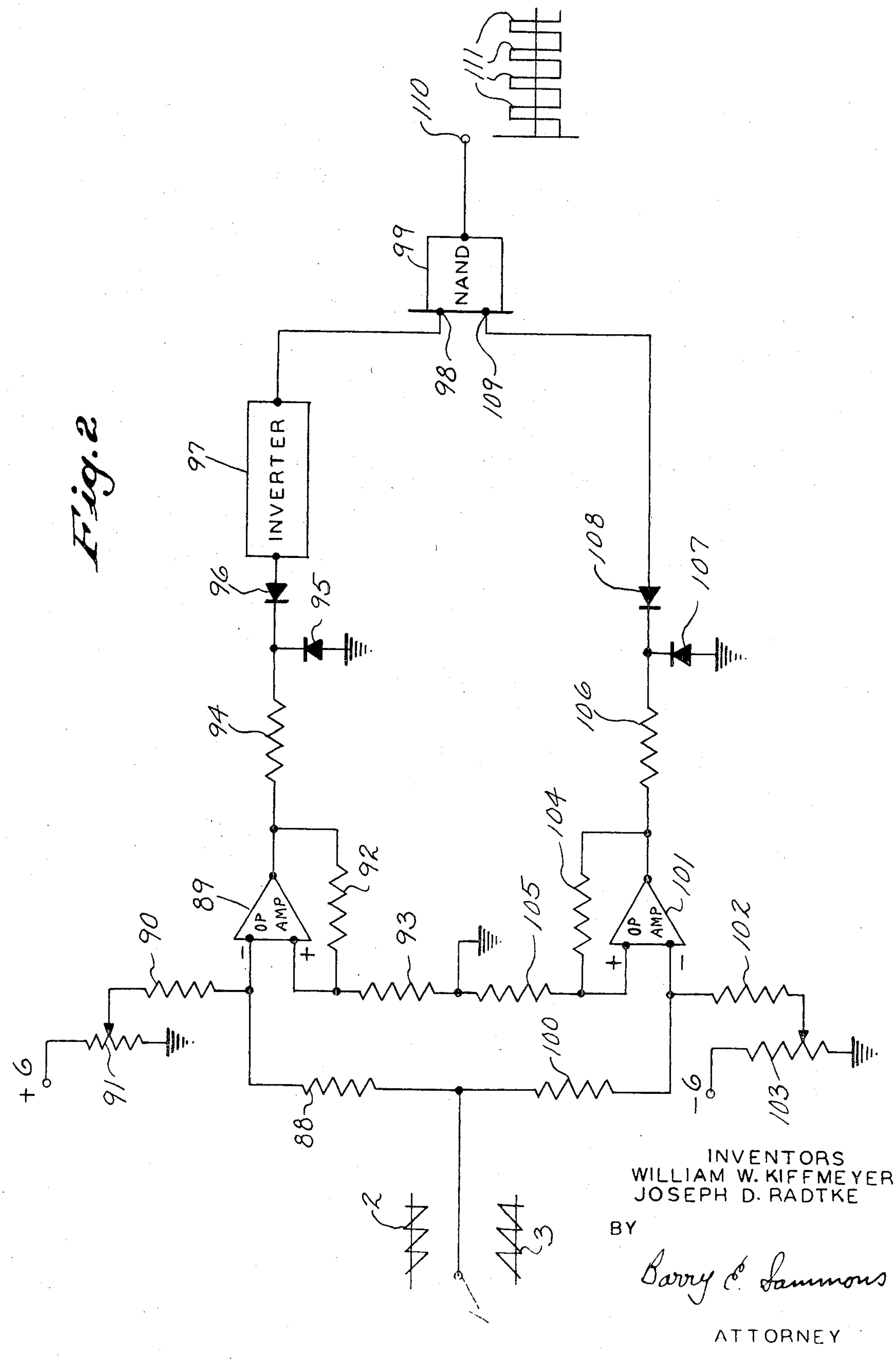
FIG. 2 is a schematic diagram of an alternative embodiment of a portion of the diagram of FIG. 1.

An alternative to the comparator and direction sensing circuits described above is shown in FIG. 2. The converter input terminal 1 is connected through a first coupling resistor 88 to the inverting input terminal of a forward operational amplifier 89. The same inverting input terminal is connected through a resistor 90 to the slider of a forward reference potentiometer 91. One end of the forward reference potentiometer 91 is connected to a positive 6-volt source and its other end is connected to circuit ground. The noninverting input terminal of the forward operational amplifier 89 is connected to its output terminal through a feedback resistor 92 and to circuit ground through a resistor 93. The output terminal of the forward operational amplifier 89 is connected through a coupling resistor 94 to the anodes of a first clamping diode 95 and a second clamping diode 96. The cathode of the first clamping diode 95 is connected to circuit ground and the cathode of the second clamping diode 96 is connected to the input terminal of an inverter 97. The output of the inverter 97 is connected to the forward input terminal 98 of an output NAND circuit 99.

The input terminal 1 also connects through a second coupling resistor 100 to the inverting input of a reverse operational amplifier 101. This inverting input also connects through a resistor 102 to the slider of a reverse reference potentiometer 103. One end of the reverse reference potentiometer 103 connects to a negative 6-volt source and its other terminal connects to circuit ground. The noninverting input of the reverse operational amplifier 101 connects through a feedback resistor 104 to its output terminal and through a resistor 105 to circuit ground. The output terminal of the reverse operational amplifier 101 connects through a coupling resistor 106 to the anodes of a third clamping diode 107 and a fourth clamping diode 108. The cathode of clamping diode 107 connects to circuit ground and the cathode of clamping diode 108 connects to a reverse input terminal 109 on the output NAND circuit 99. The output of the NAND circuit 99 serves as the output terminal 110 of the converter. The reset circuit of FIG. 1 is used with this circuit by attaching the reset resistor 26 to the input terminal 1 and the input terminals 54 and 55 of the NAND circuit 53 to the respective input terminals 98 and 109 of the output NAND circuit 99.

With no voltage applied to the input terminal 1, the positive forward reference voltage applied to the forward operational amplifier 89 saturates its output negative, or low. This low is inverted to a high by the inverter 97 and applied to the forward input terminal 98 of the output NAND circuit 99. Also, with no input voltage the negative reverse reference voltage applied to the reverse operational amplifier 101 saturates its output positive, or high. This high is applied to the reverse input terminal 109 of the output NAND circuit 99. Thus, with no input signal, the output terminal 110 is low.

When a machine tool is moving in the forward direction and the forward input signal 2 is received from the position sensor at the input terminal 1, it reaches a negative voltage level, determined by the slider on the forward reference potentiometer 91, at which the output of the forward operational amplifier 89 is driven positive, or high. This high is inverted and seen as a low at the forward input terminal 98 of the output NAND circuit 99, causing the output terminal 110 to go high. The circuit is then either reset by the forward input signal 2 or a reset pulse applied to the input terminal 1. As the machine tool moves in the forward direction, therefore, a series of digital output pulses 111 are generated at the output terminal 110.

When the machine tool is operating in the reverse direction, the reverse input signal 3 is generated by the position sensor and applied to the input terminal 1. When it reaches a preset positive voltage level, determined by the setting of the slider on the reverse potentiometer 103, the output of the reverse operational amplifier 101 is driven negative, or low. This low is applied to the reverse input terminal 109 of the output NAND circuit 99 causing the output terminal 110 to go high. The circuit is reset and continued movement of the machine tool in the reverse direction generates a series of digital output pulses 111 at the output terminal 110.

It should be apparent to those skilled in the art that other logic gates such as AND circuits can be substituted for the NAND circuits described herein, and voltage levels other than those described herein can be used. The foregoing discussion sets forth the best mode presently contemplated by the inventors of carrying out their invention and describes the invention and the manner and process of making and using it, in such full, clear, concise, and exact terms as to enable any person skilled in the art to which it pertains, or with which it is most clearly connected, to make and use the same.

However, by contrast, the subject matter which the applicants regard as their invention is particularly pointed out and distinctly claimed in the claims that follow.

We claim:

1. An analog to digital converter for digitizing the analog output signal of a machine tool position sensor, which sensor is reset each time a digit is generated, the combination comprising:

a comparator having an output terminal, said comparator connected to receive the analog signal from said position sensor, sense its magnitude and change the logic state of its output terminal when the analog signal reaches a predetermined level;

a forward sensing circuit including a first logic gate having a pair of input terminals and an output terminal, one of said input terminals connected to receive a forward reference signal and the other input terminal connected to the comparator output terminal, said logic gate adapted to change the logic state of its output terminal when the logic state of the comparator output changes and the machine tool is moving in the forward direction;

a reverse sensing circuit including a second logic gate having a pair of input terminals and an output terminal, one of said input terminals connected to receive a reverse reference signal and the other input terminal connected to the comparator output terminal, said second logic gate adapted to change the logic state of its output terminal when the comparator output changes and the machine tool is moving in the reverse direction;

wherein the outputs of the first and second logic gates are summed to provide the digital output signal.

2. An analog to digital converter as recited in claim 1 wherein an automatic reset circuit is connected to receive the digital output signal and generate a reset pulse to said comparator which is delayed a predetermined time interval.

3. An analog to digital converter as recited in claim 2 wherein the automatic reset circuit includes:

a first monostable circuit connected to receive the digital output signal at a trigger terminal and generate a pulse of predetermined duration in response thereto; and a second monostable circuit connected to receive the pulse from said first monostable circuit at a trigger terminal and generate said reset pulse in response to the trailing edge of said received pulse.

4. An analog to digital converter as recited in claim 2 wherein said comparator circuit includes an amplifier having an input terminal connected to receive and compare the magnitude of the analog signal with the magnitude of a reference signal, the polarity of said reference signal being determined by the direction of machine movement.

5. An analog to digital converter as recited in claim 4 wherein said automatic reset circuit includes:

a first monostable circuit connected to receive the digital output signal at a trigger terminal and generate a first pulse of predetermined duration in response thereto;

a second monostable circuit connected to receive the first pulse from said first monostable circuit at a trigger terminal and generate a second pulse in response to the trailing edge of said first pulse;

a forward reset logic gate having a pair of input terminals and an output terminal, one of said input terminals connected to receive said forward reference signal and the other input terminal connected to receive the second pulses from said second monostable circuit, said forward reset logic gate adapted to generate a reset pulse to the input terminal of said comparator amplifier when the machine is moving in the forward direction and a second pulse is received from said second monostable circuit; and a reverse reset logic gate having a pair of input terminals and an output terminal, one of said input terminals connected to receive said reverse reference signal and the other input terminal connected to receive the second pulses from said second monostable circuit, said reverse reset logic gate adapted to generate a reset pulse to the input terminal of said comparator amplifier when the machine is moving in the reverse direction and a second pulse is received from said second monostable circuit.

6. An analog to digital converter as recited in claim 4 wherein the outputs of the first and second logic gates are summed by an output logic gate having two input terminals and an output terminal, one of said input terminals connected to receive the output of the first logic gate in said forward sensing circuit and the other input terminal connected to receive the output of the second logic gate in said reverse sensing circuit, said output logic gate adapted to change logic state at its output terminal when the output of either the forward or reverse polarity sensing circuit changes state.

7. An analog to digital converter as recited in claim 6 wherein the logic gates are NAND circuits.

8. An analog to digital converter for digitizing the analog output signal of a machine tool position sensor, which sensor is reset each time a digit is generated, the combination comprising:

a forward operational amplifier having an input terminal and an output terminal, the input terminal connected to receive the analog signal from said position sensor and a forward reference voltage, said operational amplifier adapted to sense the level of said analog signal and change the logic state of its output terminal when the analog signal reaches a first level;

a reverse operational amplifier having an input terminal and an output terminal, the input terminal connected to receive the analog signal from said position sensor and a reverse reference voltage, said operational amplifier adapted to sense the level of said analog signal and change the logic state of its output terminal when the analog signal reaches a second level; and an output circuit including a logic gate having two input terminals and an output terminal, one of said input terminals connected to the output terminal of said forward operational amplifier and the other input terminal connected to the output terminal of said reverse operational amplifier, wherein a change of logic state at either input terminal causes a change of logic state at the output terminal of the output circuit.

9. The analog to digital converter as recited in claim 8 wherein the first voltage level of the analog signal sensed by the forward operational amplifier has one polarity and that sensed by the reverse operational amplifier has the opposite polarity; and said analog to digital converter includes an automatic reset circuit connected to the output terminal of said output circuit which generates a reset pulse to the input terminals of said operational amplifiers which is delayed a predetermined time interval.

* * * * *